United States Patent [19]
Lang et al.

[11] Patent Number: 5,715,268
[45] Date of Patent: Feb. 3, 1998

[54] LASER AMPLIFIERS WITH SUPPRESSED SELF OSCILLATION

[75] Inventors: Robert J. Lang, Pleasanton; David F. Welch, Menlo Park; Ross A. Parke, Fremont; Donald R. Scifres, Los Altos Hills, all of Calif.

[73] Assignee: SDL, Inc., San Jose, Calif.

[21] Appl. No.: 724,374

[22] Filed: Oct. 1, 1996

Related U.S. Application Data

[63] Continuation of Ser. No. 186,298, Jan. 24, 1994, abandoned.
[51] Int. Cl.$^6$ ............................................. H01S 3/18
[52] U.S. Cl. ..................... 372/50; 372/33; 372/108; 359/337; 359/346
[58] Field of Search .................... 359/337, 344, 359/346; 372/43, 45, 46, 50, 33, 108

[56] References Cited

U.S. PATENT DOCUMENTS

| | | | |
|---|---|---|---|
| 3,467,906 | 9/1969 | Cornely et al. | 372/44 |
| 4,744,089 | 5/1988 | Montroll et al. | 372/50 |
| 4,794,346 | 12/1988 | Miller | 372/50 |
| 5,088,105 | 2/1992 | Scifries et al. | 372/50 |
| 5,175,643 | 12/1992 | Andrews | 372/50 |
| 5,260,822 | 11/1993 | Missaggia et al. | 359/337 |
| 5,321,718 | 6/1994 | Wearts et al. | 372/50 |
| 5,539,571 | 7/1996 | Welch et al. | 359/344 |
| 5,555,544 | 9/1996 | Walpole et al. | 372/50 |
| 5,602,864 | 2/1997 | Welch et al. | 372/50 |

*Primary Examiner*—Rodney B. Bovernick
*Assistant Examiner*—Yisun Song
*Attorney, Agent, or Firm*—W. Douglas Carothers, Jr.

[57] ABSTRACT

A travelling-wave semiconductor laser amplifier having suppressed self-oscillation is provided. When incorporated into a master oscillator power amplifier device, such a device has improved light output versus amplifier current characteristics. Also provided is a method for suppressing self-oscillation in travelling-wave semiconductor laser amplifier structures for improving the characteristics of the device into which the amplifier is incorporated.

38 Claims, 16 Drawing Sheets

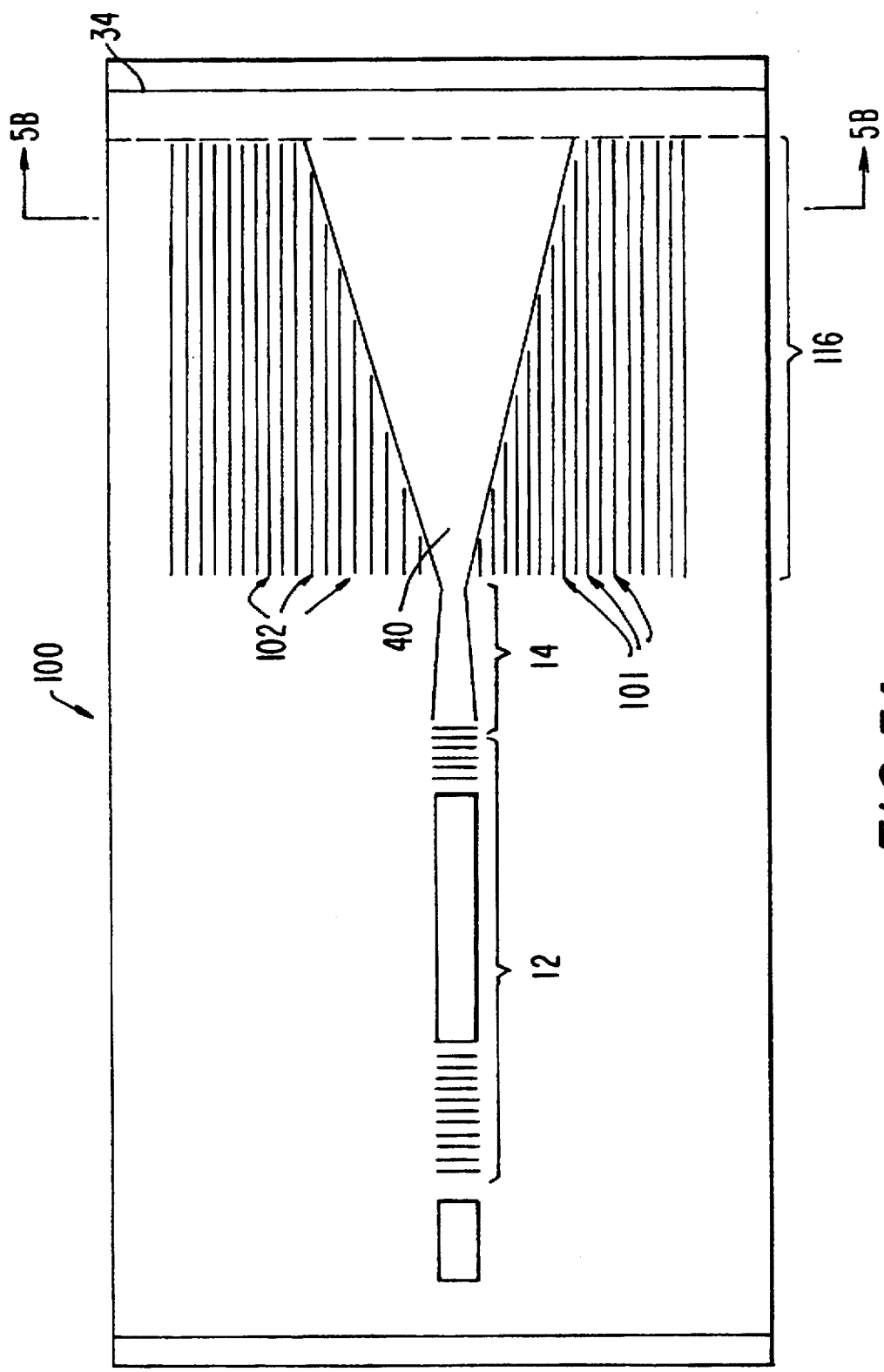

LASER AMPLIFIERS WITH SUPPRESSED SELF OSCILLATION

This is a continuation, of application Ser. No. 08/186,298, filed Jan. 24, 1994 now abandoned entitled LASER AMPLIFIERS WITH SUPPRESSED SELF-OSCILLATION.

BACKGROUND OF THE INVENTION

This invention relates to semiconductor laser amplifiers and devices using such amplifiers. More particularly, this invention relates to semiconductor laser amplifiers with suppressed self-oscillation and methods for providing such amplifiers for use in master oscillator power amplifier and other devices.

Recently, advances in the design and fabrication of semiconductor lasers have resulted in the development of high-power diffraction-limited laser sources. Such sources include master oscillator power amplifier (MOPA) devices which offer the advantages of single-frequency operation, broad-band wavelength tunability and diffraction-limited performance.

A MOPA device includes a master laser oscillator for generating a single-frequency diffraction-limited light beam which is optically coupled to a travelling-wave semiconductor laser amplifier. The purpose of the laser amplifier is to amplify the power of the oscillator output beam without significantly distorting the beams spectral and spatial quality. Recently, various efforts have been made in improving the performance of MOPA devices.

For example, commonly-assigned U.S. Pat. No. 5,103,456, which is hereby incorporated by reference in its entirety, describes a monolithic MOPA device which achieves a high power output beam in a diffraction limited, single spatial and spectral mode. That patent discloses, among other things, the use of a coupling grating disposed between the laser oscillator and the light amplifier to deflect light at angle. The orientation angle and grating period of the coupling grating are chosen to minimize feedback from the amplifier into the laser. Such reduction in feedback improves the amplifier gain and coherence achieved by the master oscillator resulting in improved MOPA device characteristics.

Copending, commonly-assigned U.S. patent application Ser. No. 08/001,735, now U.S. Pat. No. 5,392,308 is hereby incorporated by reference in it entirety, describes a semiconductor amplifier structure having an integral spatial mode filter. That application discloses, among other things, a wavelength tunable, external cavity, semiconductor MOPA device incorporating the amplifier structure therein for improving the quality of the output beam.

Copending, commonly-assigned U.S. patent application Ser. No. 08/202,359, filed Feb. 28, 1994, based on Ser. No. 07/948,673, filed Sep. 21, 1992, now abandoned which now U.S. Pat. No. 5,539,571, which is based upon a continuation-in-part application Ser. No. 202,359, filed Feb. 21, 1994, of that application and is hereby incorporated by reference in it entirety, describes a differentially pumped amplifier structure for improving modulation characteristics at high power. That application discloses, among other things, a monolithically integrated MOPA device including a distributed Bragg reflector laser oscillator, a single mode preamplifier and the differentially pumped amplifier structure for increasing the power, efficiency and coherence of device operation.

Copending, commonly-assigned U.S. patent application Ser. No. 08/010,279, now U.S. Pat. No. 5,321,718, which is hereby incorporated by reference in it entirety, also describes a MOPA device. That application discloses, among other things, an astigmatism-correcting lens system having at least one cylindrical lens surface to be disposed in the output path of the MOPA device to provide a beam with substantially equal lateral and transverse beam width dimensions and beam divergence angles.

Although the MOPA devices discussed above have improved device performance, there is still room for further improvement. In particular, the above-discussed MOPA devices and others include a power amplifier structure which can, in some situations, support a self-oscillation mode during periods in time when the master oscillator is turned OFF and the amplifier is ON.

Self-oscillation occurs when current injected across the pn junction of the amplifier is large enough to exceed a lasing threshold and feedback associated with the geometry of the amplifier cavity is such that the amplifier is able to oscillate in a lasing mode. Such oscillation may generate significant coherent light which may degrade the performance characteristics of the overall MOPA device. For example, the light output versus amplifier current characteristics of the device can show significant output light while the master oscillator is OFF during self-oscillation of the amplifier. Such output light, if collected by the collection system, is undesirable.

In light of the above, it would therefore be desirable to be able to provide an improved semiconductor laser amplifier having reduced light output due to self-oscillation for use in MOPA and other devices.

It would also be desirable to be able to provide a MOPA device with improved light output versus amplifier current characteristics.

It would further be desirable to be able to provide a method for suppressing self-oscillation in a semiconductor laser amplifier for use in MOPA and other devices.

SUMMARY OF THE INVENTION

It is an object of this invention to provide an improved semiconductor laser amplifier having reduced light output due to self-oscillation for use in MOPA and other devices.

It is also an object of this invention to provide a MOPA device with improved light output versus amplifier current characteristics.

It is a further object of this invention to provide a method for suppressing self-oscillation in a semiconductor laser amplifier for use in MOPA and other devices.

In accordance with this invention, there is provided a semiconductor laser amplifier including (1) a current-pumped gain region formed on a semiconductor substrate having an input adapted for receiving input light of a first intensity and having an output adapted for providing amplified light at a second intensity; and (2) a second region including at least a portion of the gain region formed on the semiconductor substrate for supporting a parasitic mode of oscillation. The parasitic mode of oscillation reduces the level of light emitted at the output of the amplifier which is not amplified input light. The laser amplifier can be employed in MOPA and other devices.

There is also provided a method for suppressing self-oscillation in semiconductor laser amplifiers for use in MOPA and other devices. The method includes the steps of (1) forming a current-pumped gain region on a semiconductor substrate, and (2) forming a second region including at least a portion of the gain region on the semiconductor substrate for supporting a parasitic mode of oscillation. The parasitic mode of oscillation reduces the level of light emitted at the output of the amplifier which is not amplified input light.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which:

FIG. 5A illustrates an embodiment of a monolithically integrated MOPA device incorporating a second embodiment of a power amplifier in accordance with the present invention;

DETAILED DESCRIPTION OF THE INVENTION

Figure 1A:
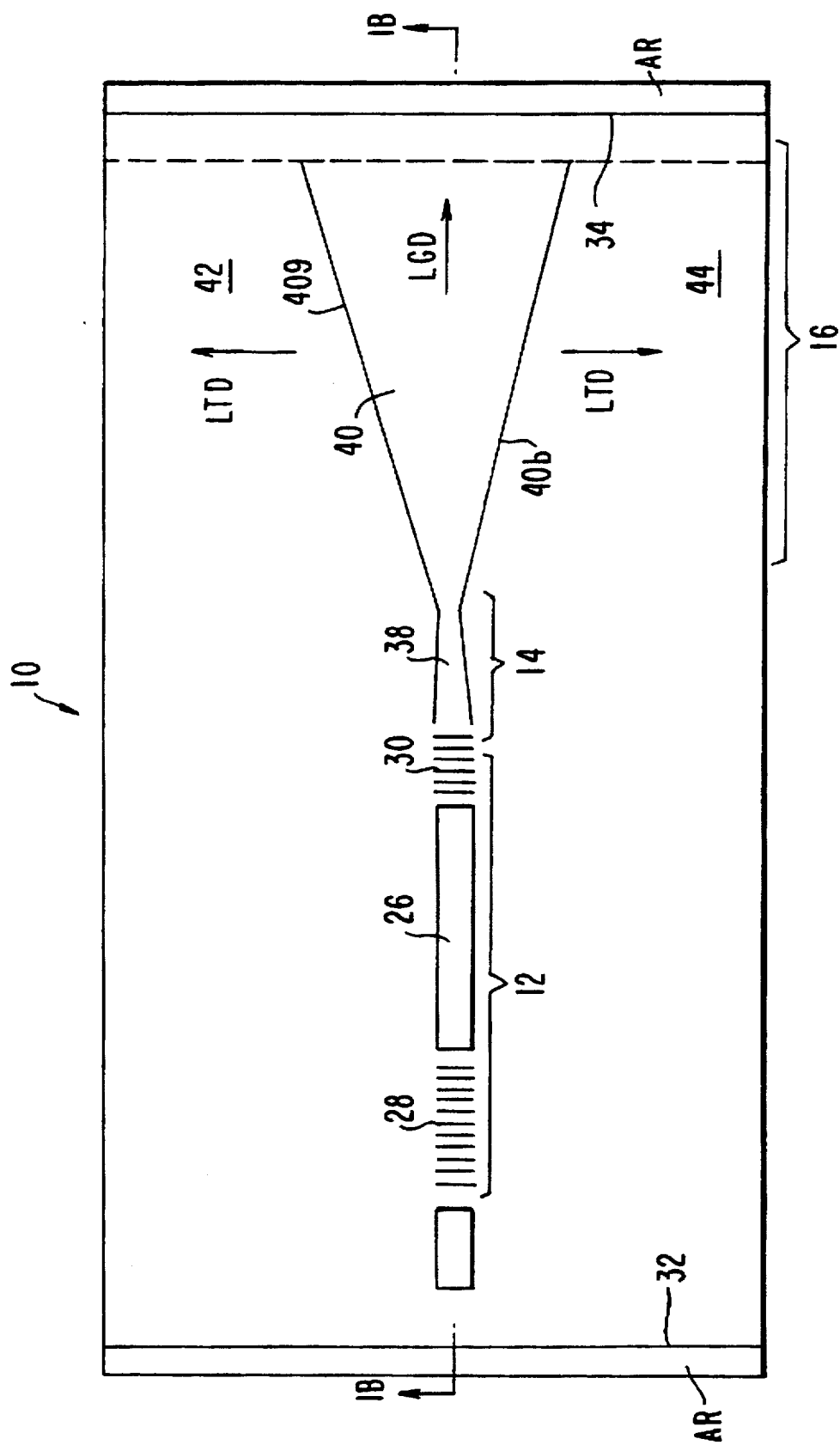
FIG. 1A illustrates a monolithically integrated MOPA device incorporating a prior art travelling-wave semiconductor laser amplifier.
Figure 1B:
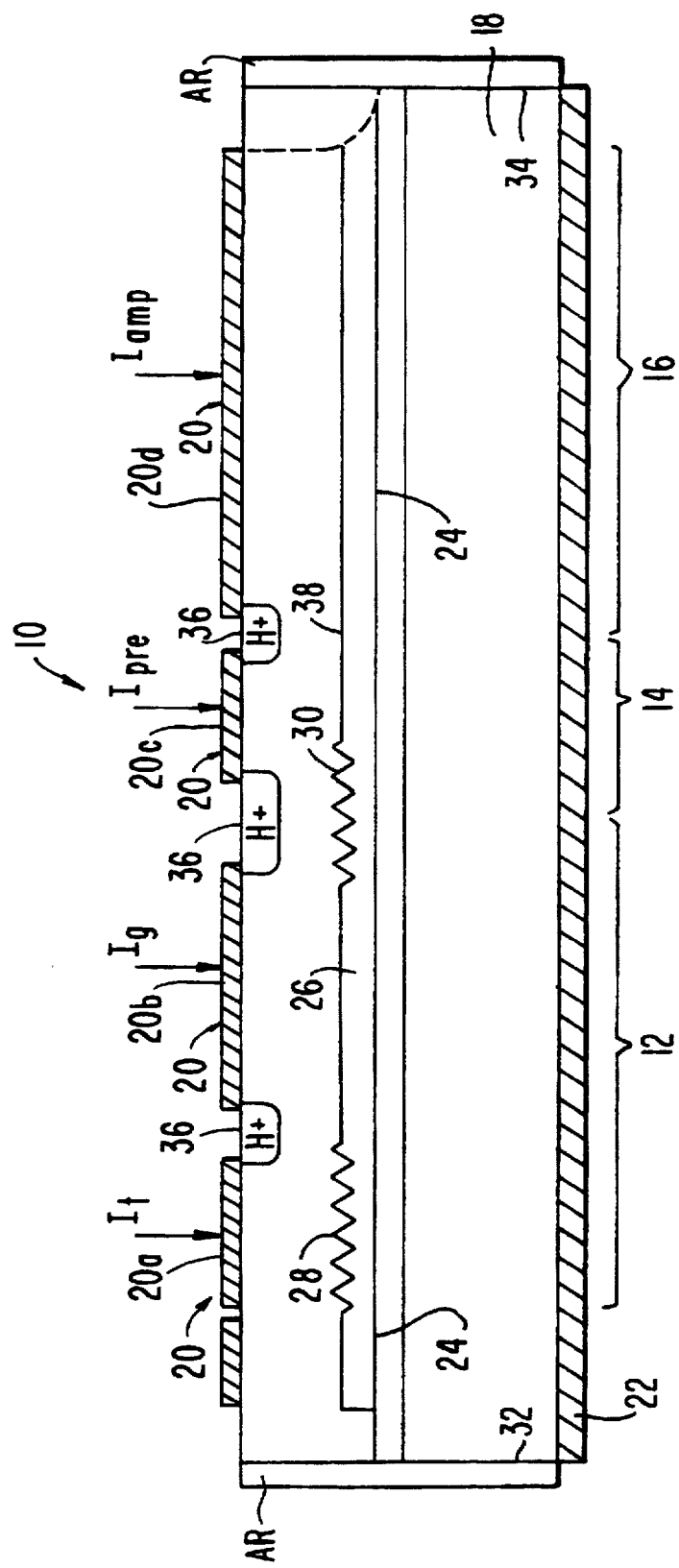
FIG. 1B is a cross-sectional view of the MOPA device of FIG. 1A, taken along line 1B—1B of FIG. 1A.

FIGS. 1A and 1B illustrate a monolithically integrated MOPA device incorporating a prior art travelling-wave semiconductor laser amplifier. As shown in those figures, MOPA device 10 includes single mode diode laser oscillator 12, optical reamplifier 14, and laser amplifier 16, all formed on a common substrate 18. MOPA device 10 includes a semiconductor material body with a plurality of contiguous semiconductor layers disposed on substrate 18 and with electrodes 20 and 22 provided on top and bottom surfaces of the body. Typically, the material composition is some combination of group III-V compound semiconductors, such as GaAs/AlGaAs, InGaAs/AlGaAs or InP/InGaAsP. However, other direct bandgap semiconductor materials may also be used. The semiconductor material body can be formed with a homostructure, single heterostructure or, preferably, a double heterostructure or multiheterostructure. All such structures include an active light emitting region 24 near a pn junction in the body. Active region 24 may be a single active layer, a single quantum well structure or a multiple quantum well (MQW) structure. Strained-layer superlattice structures may also be used.

Electrodes 20 and 22 provide a forward electrical bias across the pn junction and inject electrical current $I_t$, $I_g$, $I_{pre}$ and $I_{amp}$ through active region 24 byway of electrical contacts 20a, 20b, 20c and 20d, respectively. Thus, a pump current $I_g$ greater than a lasing threshold current injected through active region 24 in gain section 26 of laser oscillator 12 by contact 20b causes light waves to be generated in gain section 26 and to propagate under lasing conditions. Tuning current $I_t$ and its ability to tune the frequency of laser oscillator 12, is discussed in more detail in above-incorporated U.S. Pat. No. 5,539,571.

Active region 24 and the adjacent layers above and below it form a transverse waveguide for light propagation. The term "transverse" is used herein to refer to the direction perpendicular to the plane of active region 24. Lateral waveguiding is also provided in portions of the MOPA device which are specified below. The term "lateral" refers to the direction (LTD) in the plane of the active region perpendicular to the direction of propagation. The direction of laser light propagation itself is referred to as the "longitudinal" direction (LGD).

Diode laser oscillator 12 is a distributed Bragg reflector (DBR) laser defined by first or second order DBR gratings 28 and 30 bounding single mode gain section 26. Lateral real refractive index waveguiding is used to define single mode gain section 26. Gratings 28 and 30 are discussed in more detail in above-incorporated U.S. patent application Ser. No. 07/948,673.

In order to reduce residual reflections off of rear facet 32 and to prevent such light from coupling back through rear DBR grating 28 into laser oscillator 12, grating 28 is made highly reflective, such as by giving it a large number of teeth, and facet 32 is antireflection (AR) coated to give it very low reflectivity.

The output light from master oscillator 12 is coupled to preamplifier 14 prior to being injected into amplifier 16. Preamplifier 14 has a single mode waveguide 38. Active region 24 in waveguide 38 is electrically pumped with a current $I_{pre}$ injected through conductive contacts 22 and 20c. Contact 20c for preamplifier 14 may be electrically isolated from adjacent contacts for the laser oscillator's gain region 26 (i.e., contact 20b) and for amplifier 20 (i.e., contact 20d) by means of proton (H+) surface implants 36 or by other known isolation means. Preamplifier 14 is described in more detailed in above-incorporated U.S. patent application Ser. No. 07/948,673.

The output of preamplifier 14 is coupled to flared power amplifier 16. Amplifier 16 has a transverse waveguiding region 40 with an active light emitting gain region 24 sandwiched between adjacent, higher, bandgap, lower refractive index layers above and below active region 24. Amplifier 16 is electrically pumped with an amplification current $I_{amp}$ through conductive contacts 22 and 20d. The width of top conductive contact 20d above amplifier 16, and consequently the width of the gain region, is flared such that it has a first width at the input end of amplifier 16 adjacent the output of preamplifier waveguide 38 and a second width at the output end of amplifier 16 that is significantly wider than the first width. Typically, the amount of flare or increase in width in the amplifier's pumped gain region defined by contact 20d, matches or is only slightly larger than the divergence of the light beam received from preamplifier 14. The flare of pumped gain region 40 of amplifier 20 is typically linear, as shown in FIG. 1.

Areas 42 and 44 outside of pumped gain region 40 of flared waveguide 16 is typically made to have high loss, such as by compositional change to remove the transverse waveguiding properties of one or both of the layers sandwiching the active region layer(s) 24 or by other known means of increasing absorption or loss, in order to reduce distortions associated with edge effects of amplifier 16.

Figure 2:
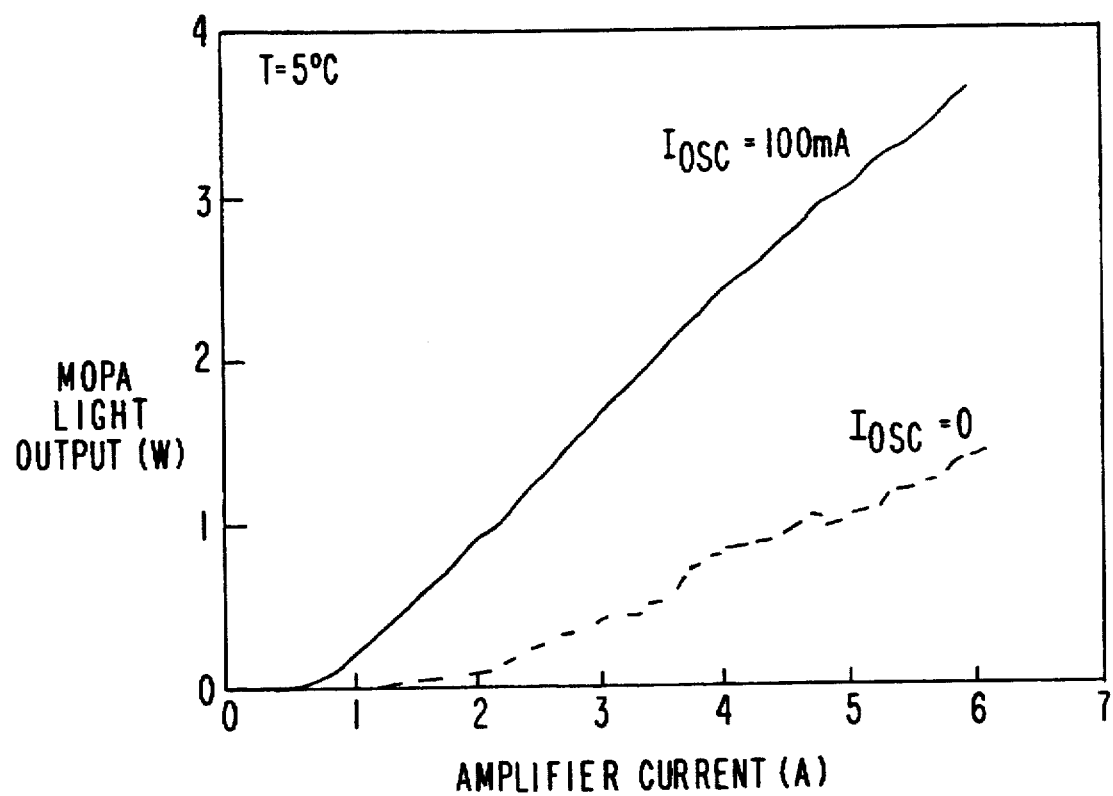
FIG. 2 illustrates the light output versus amplifier current characteristics of a MOPA device incorporating a prior art travelling-wave laser amplifier.

As discussed above, MOPA devices as shown in FIG. 1 and other non-integrated MOPA devices which include a semiconductor laser amplifier may be susceptible to self-oscillation. The effects of such self-oscillation on the near-field light output versus amplifier current characteristics of the MOPA is illustrated by FIG. 2. As shown in FIG. 2, while the master oscillator is ON (i.e., pump current $I_g$ greater than that needed for lasing in the master oscillator), the light output increases as amplifier current $I_{amp}$ is increased. The rate at which the light output increases decreases at high current levels due to gain saturation in the oscillator. However, while the master oscillator is OFF, light output is still significant as the amplifier current $I_{amp}$ is increased. Such light output is generally attributed to amplified spontaneous emission (superluminesence) at low current levels and self-oscillation at high current levels, both of which are associated with amplifier 16.

Because self-oscillation of amplifier 16 may generate coherent light rays that propagate in a mode that closely resembles the main MOPA mode (i.e., in longitudinal direction LGD), such rays exit MOPA device 10 through AR-coated output facet 34 where they may be collected by the collection system. Although laser oscillator 12 is OFF, MOPA device 10 emits light having characteristics that substantially overlap those of light that is emitted while oscillator 12 is ON. Such characteristics are not desirable in applications where the ability to modulate the output light by modulating the laser oscillator is important.

In accordance with the present invention, a method is provided for suppressing effects of self-oscillation in prior art travelling-wave semiconductor amplifiers. A semiconductor laser amplifier, when made in accordance with the method of the present invention and employed in MOPA or other optical devices, can improve the performance of those devices.

Figure 3:
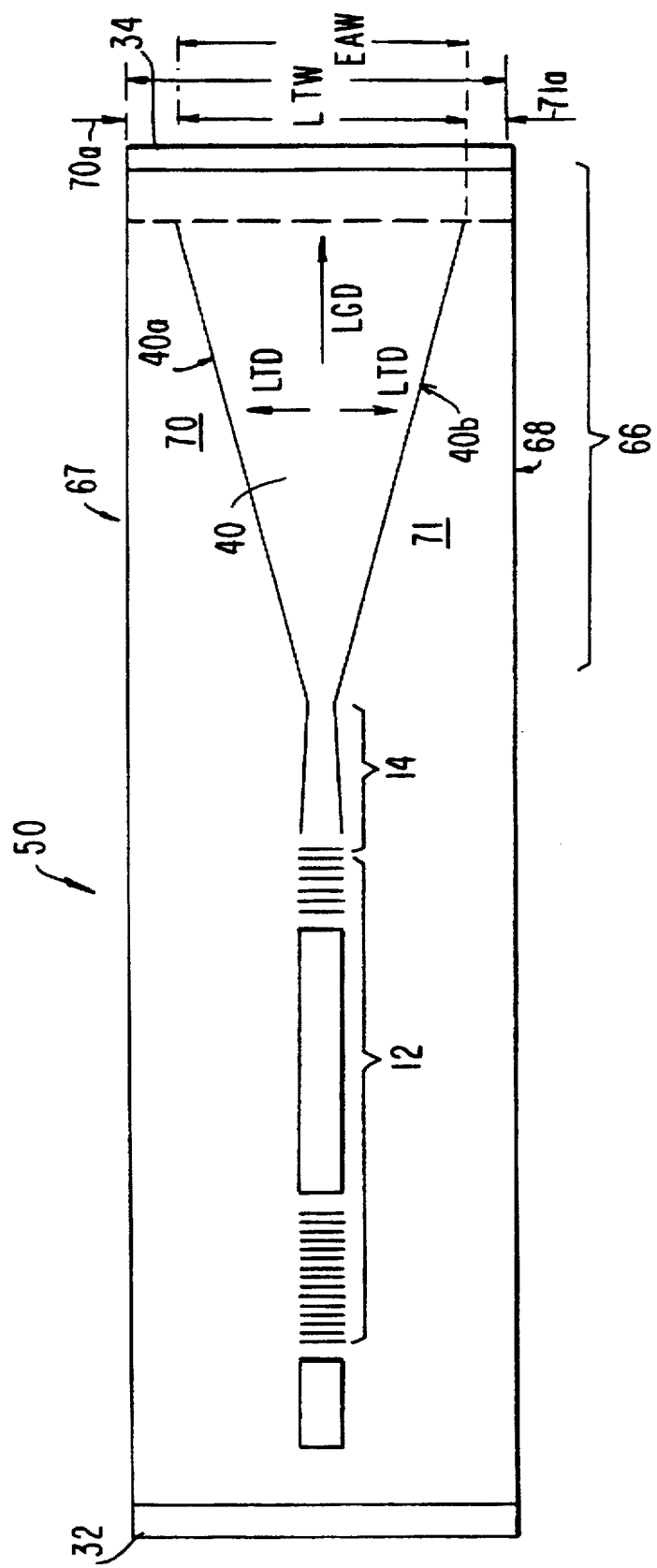
FIG. 3 illustrates an embodiment of a monolithically integrated MOPA device incorporating a first embodiment of a power amplifier in accordance with the present invention.

FIG. 3 illustrates an embodiment of a monolithically integrated MOPA device incorporating a first embodiment of a semiconductor laser amplifier (travelling-wave) in accordance with the present invention. MOPA device 50 includes single mode diode laser oscillator 12 and optical preamplifier 14 similar to those discussed above with respect to FIGS. 1A and 1B. In addition, device 50 includes laser amplifier 66 in accordance with the present invention.

Amplifier 66 includes transverse waveguiding region 40 with boundaries 40a and 40b as in FIGS. 1A and 1B. Adjacent boundaries 40a and 40b are cleaved facets 67 and 68 for supporting a parasitic mode of amplifier oscillation which reduces the level of light emitted at the output of the amplifier which is not amplified light from the oscillator (i.e., input light). Laser amplifier 66 works as follows.

Cleaved facets 67 and 68 reduce the lateral width LTW of amplifier 66 so as to intentionally introduce a parasitic mode of oscillation that has a lasing threshold lower than that of the primary longitudinal self-oscillation mode. Thus, the parasitic mode of oscillation that is supported by facets 67 and 68 oscillates prior to any longitudinal mode having characteristics similar to the main MOPA mode. Accordingly, any coherent light that is generated by amplifier 66 during periods when oscillator 12 is OFF is directed towards lateral direction LTD and not towards output facet 34 in the longitudinal direction LGD. As a result, the intentional introduction of a parasitic mode of oscillation directs any self-generated coherent light in a direction different than the main MOPA mode which allows such light to be separated from amplified input light associated with the longitudinal self-oscillation mode.

Figure 4:
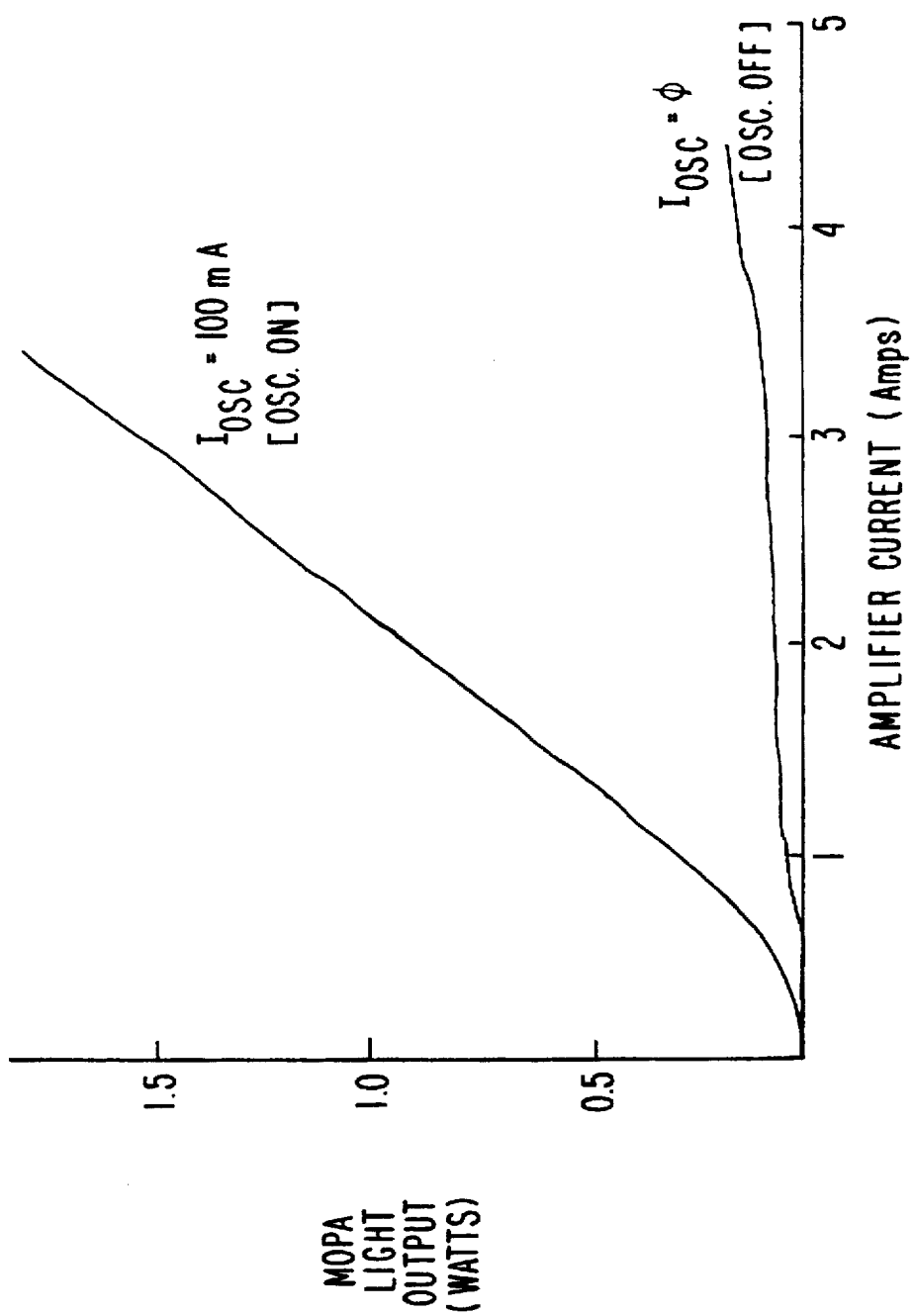
FIG. 4 illustrates the light output versus amplifier current characteristics of the MOPA device of FIG. 3.

As shown in FIG. 4, the above parasitic mode of self-oscillation improves the light output versus amplifier current characteristics of the overall MOPA device. In accordance with the present invention, with oscillator 12 ON, oscillator 12 saturates the amplifier gain below the threshold for the parasitic mode and light exits MOPA 50 out facet 34. With oscillator 12 OFF, the parasitic mode turns ON, clamping the gain of amplifier 66 at relatively low levels and reducing the amount of light out of facet 34. In comparing FIG. 4 to FIG. 2, it is seen that the intentional introduction of a low-threshold parasitic mode also reduces the amount of amplified spontaneous emission light that is collected at low current levels.

In accordance with the present invention, the threshold for the parasitic mode of self-oscillation is reduced, and thus lower than that of the longitudinal self-oscillation mode, because the optical path length for lateral light rays between the lateral cleaved facets is reduced in the amplifier of FIG. 3 compared to that in FIG. 1. Although lateral light rays travel through the same amount of gain-guided material 40 in FIGS. 1 and 3, they travel through less high-loss material (i.e., material between the cleaved lateral facets and gain-guided region boundaries 40a and 40b of the amplifier) in the amplifier of FIG. 3. Thus, because the total power loss (due to, for example, free carrier absorption and defect-center scattering in the regions between the cleaved lateral facets and gain-guided region boundaries 40a and 40b of the amplifier) for such rays are reduced in the laser amplifier of FIG. 3, in comparison to that of FIG. 1, the threshold for self-oscillation in the lateral direction is also accordingly reduced.

In accordance with the present invention, for exit aperture widths EAW (FIG. 3) from about 130 to about 400 microns, gap spacings 70a and 71a (FIG. 3) in a range from about 10 to about 50 microns, preferably 20 microns, can be sufficient to support a low-threshold parasitic mode of self-oscillation in the lateral direction. Of course, other dimensions are also possible depending upon the particular laser amplifier geometry employed. Furthermore, if desired, a coating could be applied to the lateral cleaved facets (67,68) to provide a mirror at those facets for providing similar effects as decreasing the lateral spacing LTW between cleaved lateral facets. Such mirrors have a tendency to increase lateral feedback and, thus, reduce the threshold for self-oscillation.

Thus, a first embodiment of a travelling-wave laser amplifier in accordance with the present invention has been described. When incorporated into a MOPA device, the laser amplifier suppresses self-oscillation which is responsible for degrading the light output characteristics of the device. The laser amplifier includes an intentionally introduced waveguiding region which supports a parasitic mode of self-oscillation in the amplifier for reducing the level of light emitted at the output of the amplifier which is not amplified input light associated with the longitudinal self-oscillation mode.

Figure 5B:
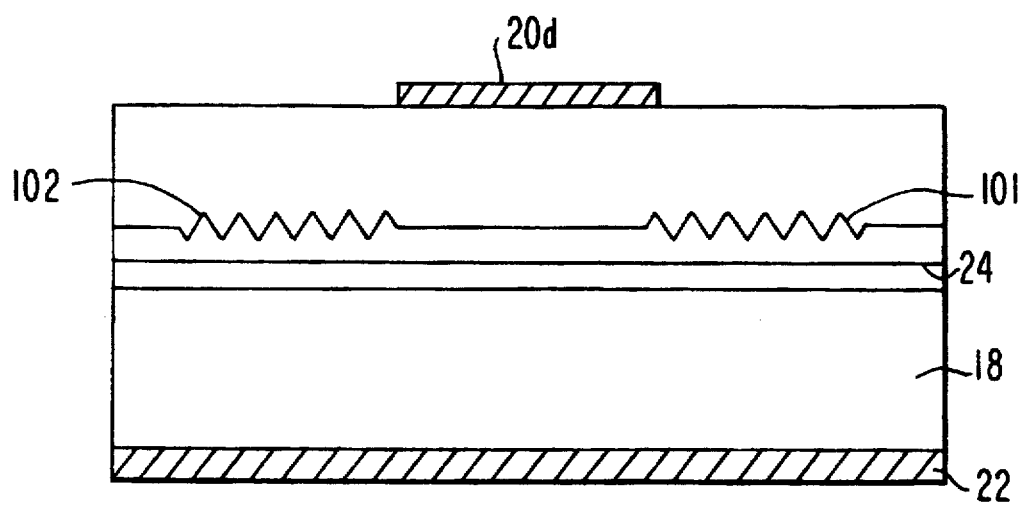
FIG. 5B is a cross-sectional view of the MOPA device of FIG. 5A, taken through line 5B—5B of FIG. 5A.

FIGS. 5A and 5B illustrate another embodiment of a monolithically integrated MOPA device which incorporates a second embodiment of a laser amplifier in accordance with the present invention.

MOPA device 100 is similar to that shown in FIGS. 1A and 1B except for the introduction of gratings 101 and 102 which support a low-threshold self-oscillation mode which allows associated with master oscillator 12. Gratings 101 and 102 can be fabricated using substantially the same process as that to produce grating 28 and 30 shown in FIG. 1B (Except, of course, they are fabricated in a substantially perpendicular direction for this example). Amplifier 116 works in MOPA device 100 as follows.

With master oscillator 12 ON, the oscillator saturates amplifier 116's gain below the threshold of the parasitic mode produced by gratings 101 and 102 and the MOPA operates substantially normally. With the oscillator OFF, the amplifier gain rises until the parasitic mode—introduced by gratings 101 and 102—begins to lase, at which point the gain is clamped; the amplifier's longitudinal self-oscillation mode that overlaps the MOPA mode never reaches threshold. Thus, the MOPA light output characteristics are improved similarly to those in FIG. 4.

Thus, a second embodiment of a travelling-wave laser amplifier in accordance with the present invention has be described. When incorporated into a MOPA device, the laser amplifier supports a low-threshold parasitic mode of self-oscillation for reducing the level of light emitted at the output of the amplifier which is not amplified input light associated with the longitudinal MOPA mode. The parasitic mode is provided by gratings oriented to diffract light rays in a direction which allows parasitic mode light to be separated by angle from amplified input light associated with the longitudinal direction of the MOPA device.

The above methods illustrated by FIGS. 3, 5A and 5B for providing a low-threshold parasitic mode of self-oscillation to improve the light output characteristics of a MOPA device can also be accomplished by a variety of other structures. A few of many such structures are discussed below.

Figure 6A:
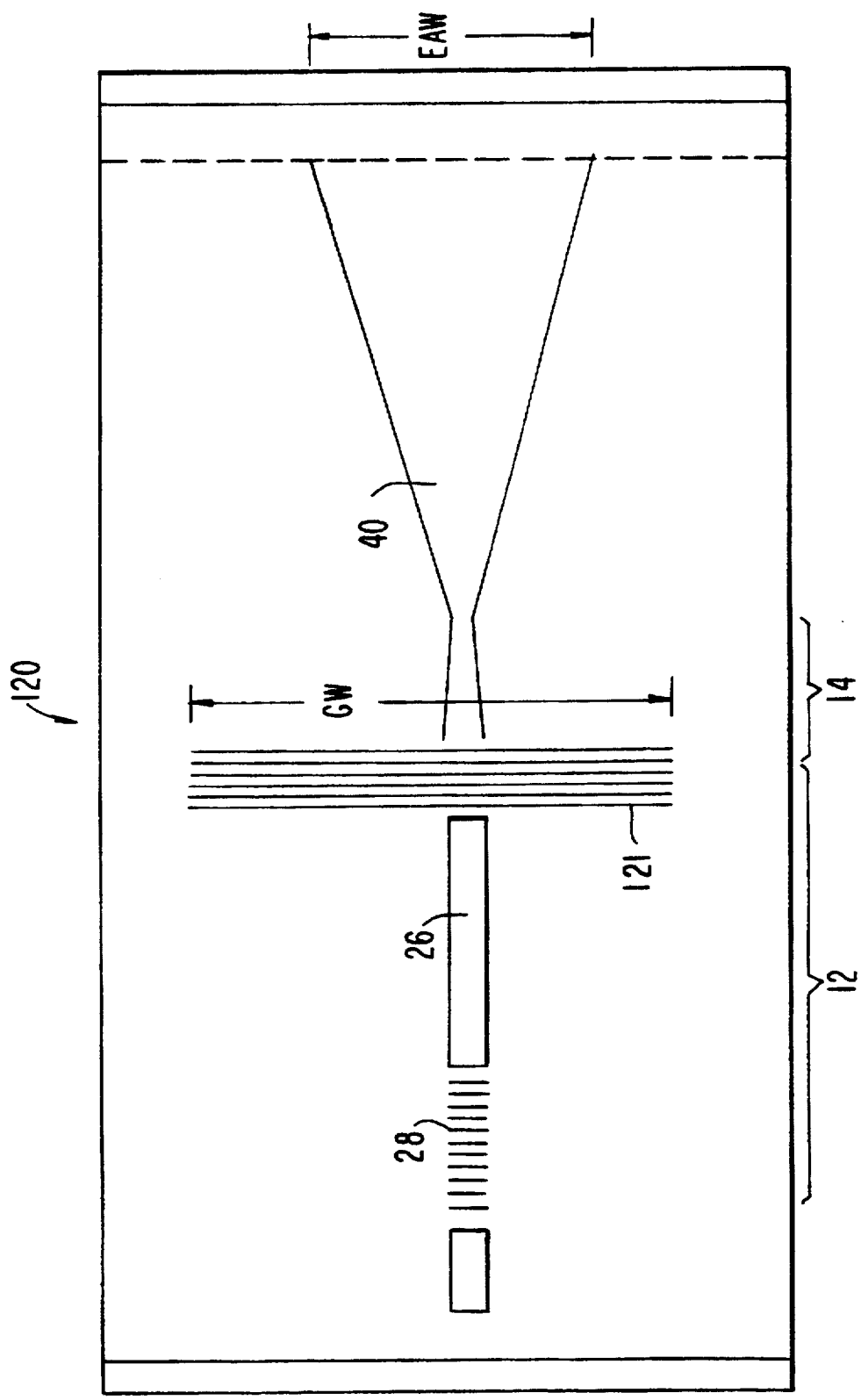
FIG. 6A illustrates an embodiment of a monolithically integrated MOPA device incorporating a third embodiment of a power amplifier in accordance with the present invention.

FIG. 6A illustrates a monolithically integrated MOPA device in accordance with the present invention for providing a parasitic mode of self-oscillation to improve the light output characteristics. Device 120 is similar to that in FIGS. 1A and 1B except for the introduction of gratings 121 which are an extension of front gratings 30 of oscillator 12. Thus, gratings 121 in FIG. 6A have a wider grating width GW in the lateral direction than gratings 30 in FIG. 1A. Device 120 works as follows.

Figure 6B:
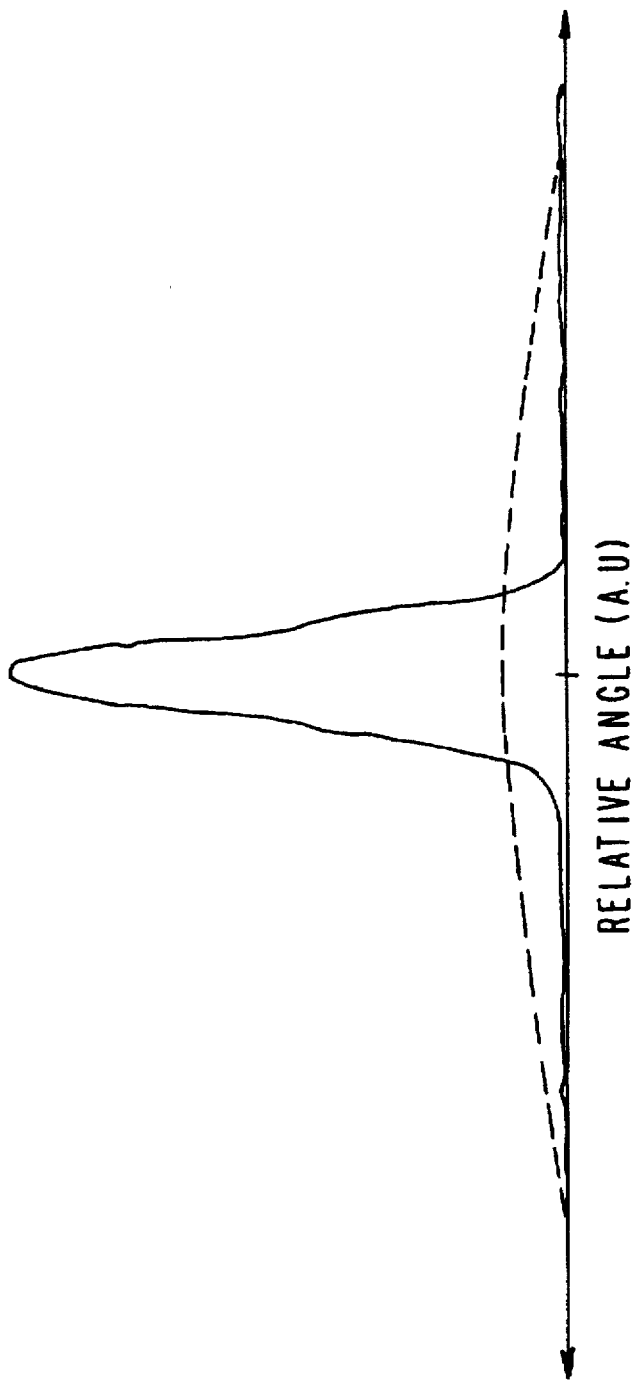
FIG. 6B illustrates the radiation patterns (in arbitrary relative angle units) for the MOPA device of FIG. 6A measured at the focal plane of the MOPA.

Gratings 121 are optically coupled to support a parasitic mode of self-oscillation generating light rays that propagate in the longitudinal direction. However, because of the large grating width GW relative to the exit aperture width EAW, the parasitic light rays are nearly-collimated and, thus, have a substantially constant phase front. Accordingly, the radiation pattern of such parasitic light at the focal plane of the main MOPA mode is broad in comparison to that of the main MOPA mode. This aspect of the present invention is illustrated by FIG. 6B, which compares the radiation pattern of the main longitudinal MOPA mode while the oscillator is ON (solid line) to that of the parasitic MOPA mode while the oscillator is OFF (dashed line). As can be seen from FIG. 6B, that although MOPA device 120 supports self-oscillation in the longitudinal direction, the radiation patterns do not substantially overlap, thus allowing for the collection of the main MOPA mode light while discriminating against the broad parasitic light by the proper choice of a collection system.

Thus, FIGS. 6A and 6B illustrate that the method of the present invention includes intentionally introducing a low-threshold parasitic mode of self-oscillation which supports the generation of coherent light having phase front characteristics that do not substantially overlap the main MOPA mode—even though the parasitic light exits the amplifier at the same end as the main longitudinal MOPA light. Because the phase front characteristics of such light do not substantially overlap the main MOPA mode, such light can be separated by focal position from main MOPA mode light.

Figure 7A:
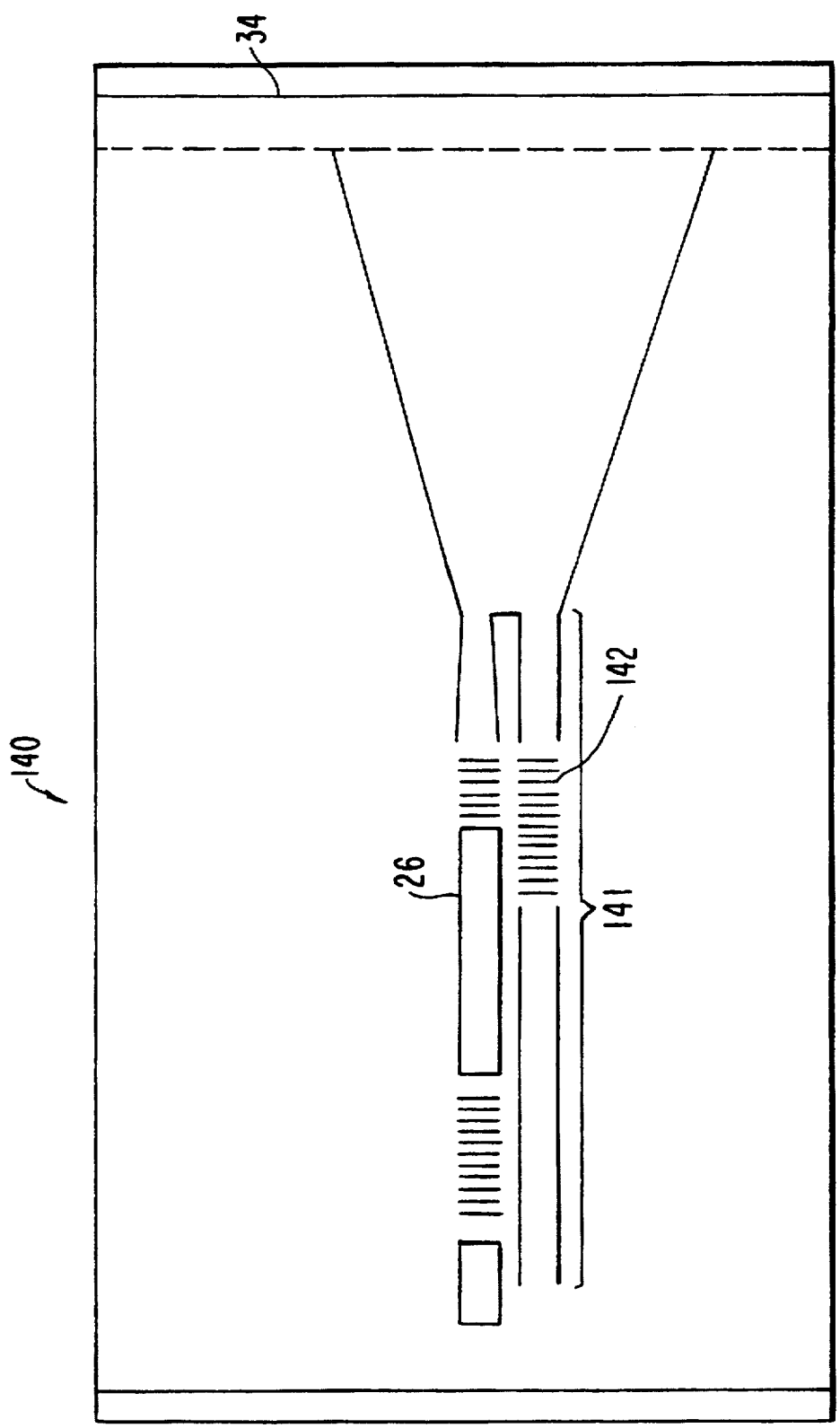
FIG. 7A illustrates an embodiment of a monolithically integrated MOPA device incorporating a fourth embodiment of a power amplifier in accordance with the present invention.

FIG. 7A illustrates another monolithically integrated MOPA device in accordance with the present invention for providing a low-threshold parasitic mode of self-oscillation to improve the light output characteristics. Device 140 is similar to that in FIGS. 1A and 1B except for the introduction of parasitic waveguide 141 parallel to master oscillator waveguide 26. Parasitic waveguide 141 includes front grating 142 having a high reflectivity for supporting a parasitic mode of oscillation with a radiation pattern that is spatially separated from the main MOPA mode. Such spatial separation is provided by parasitic waveguide 141 because grating 142 reflects light towards facet 34 that has a virtual source point shifted laterally from the virtual source point of the main MOPA mode.

Figure 7B:
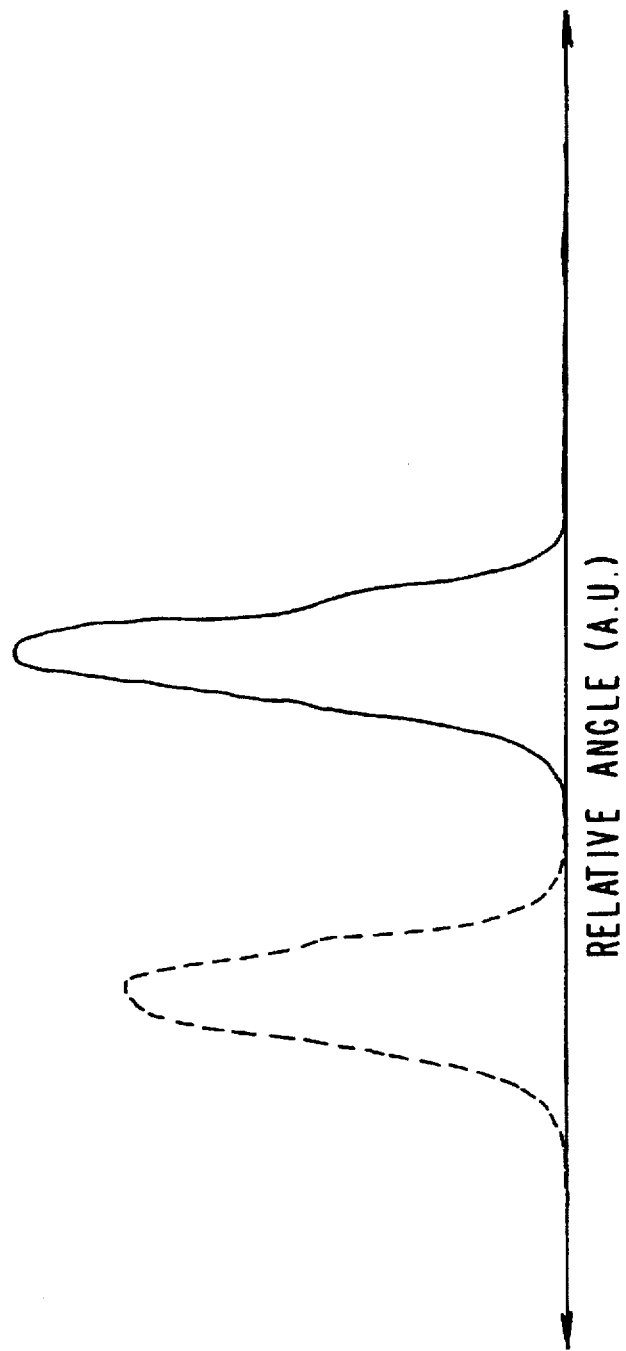
FIG. 7B illustrates the radiation patterns (in arbitrary relative angle units) for the MOPA device of FIG. 7A measured at the focal plane of the MOPA.

The spatial separation aspect of the radiation pattern associated with MOPA 140 is illustrated by FIG. 7B, which compares the radiation pattern at the focal plane of the main longitudinal MOPA mode while the oscillator is ON (solid line) to that of the parasitic MOPA mode while the oscillator is OFF (dashed line). As can be seen from FIG. 7B, although MOPA device 140 supports longitudinal self-oscillation, the radiation patterns do not substantially overlap—thus allowing for the collection of the main MOPA mode light while discriminating against the spatially separated parasitic light by the proper choice of a collection system.

Figure 8A:
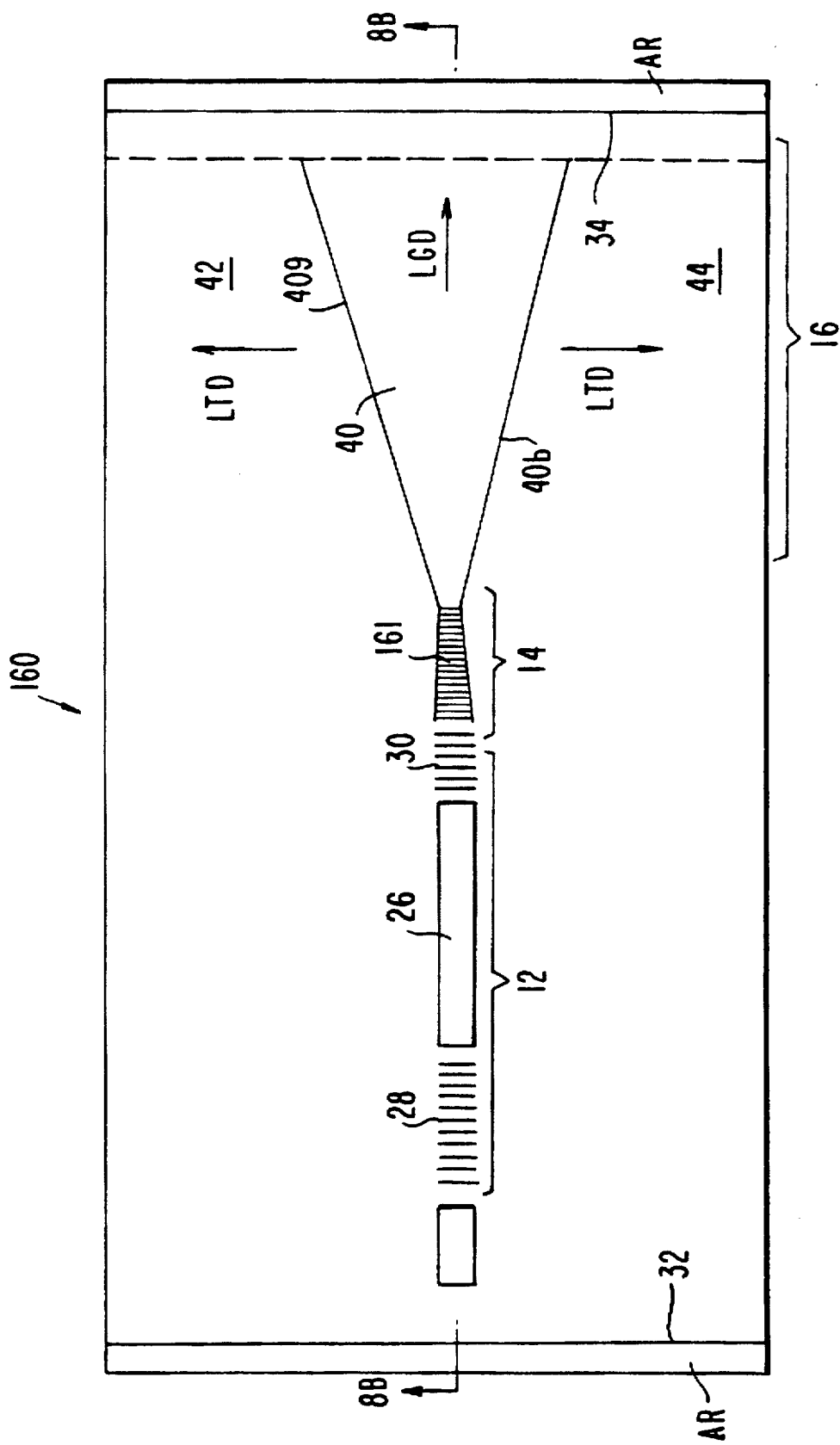
FIG. 8A illustrates an embodiment of a monolithically integrated MOPA device incorporating a fifth embodiment of the power amplifier in accordance with the present invention.
Figure 8B:
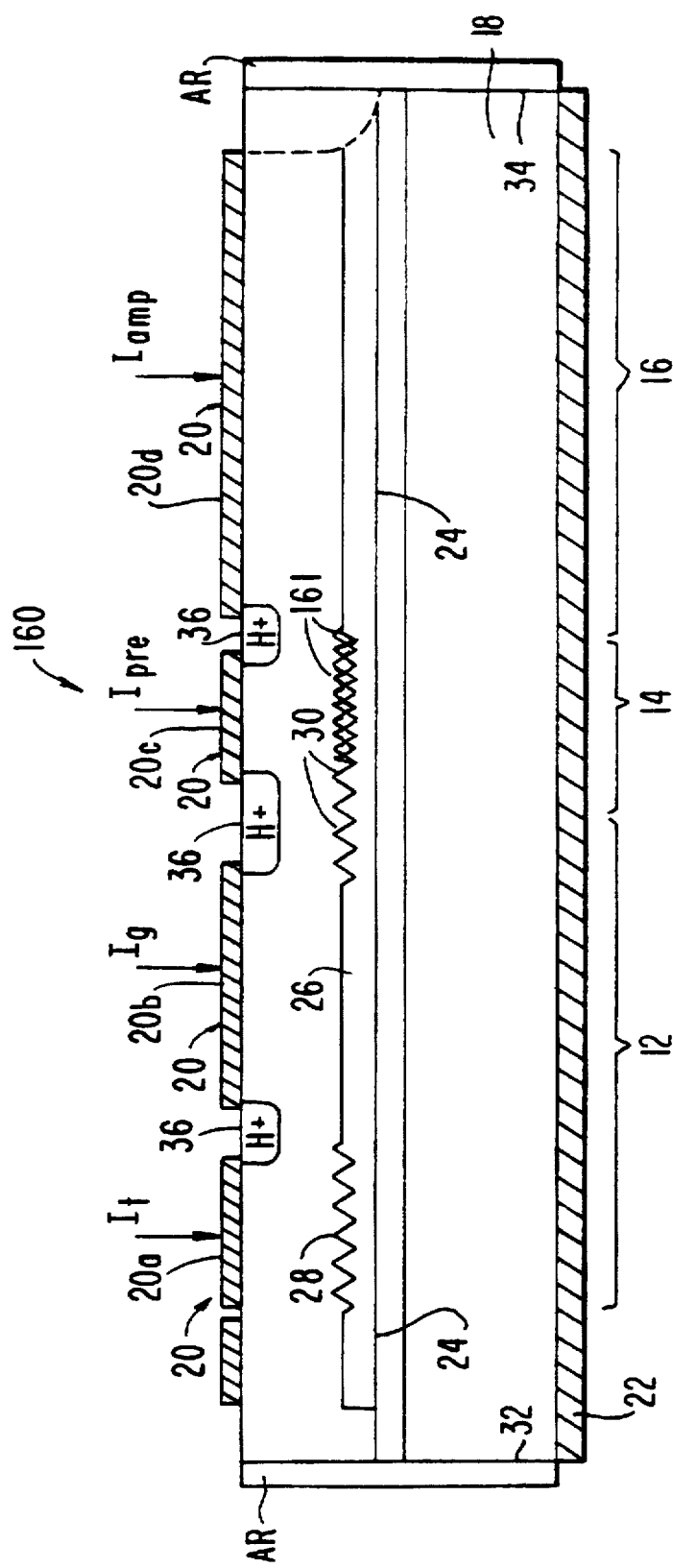
FIG. 8B is a cross-sectional view of the MOPA device of FIG. 8A, taken along line 8B—8B of FIG. 8A.

FIGS. 8A and 8B illustrate another monolithically integrated MOPA device in accordance with the present invention for providing a low-threshold parasitic mode of self-oscillation to improve the light output characteristics. Device 160 is similar to that in FIGS. 1A and 1B except for the introduction of an additional grating 161 which occupies the region of preamplifier 14. The periodicity of gratings 161 is chosen, as discussed below, to be different than that associated with gratings 128 and 130 of laser oscillator 12 so as to allow separation of light based on wavelength.

Because the periodicity of gratings 161 is chosen to be different than that of gratings 28 and 30, the wavelength of self-oscillation light associated with flared-power amplifier 20 will be different than that associated with laser oscillator 12. This is the case because the feedback associated with gratings 161 dictates the wavelength of the self-oscillation light. In accordance with the present invention, the light which exits through output facet 34 in the longitudinal direction LGD will have a wavelength which depends upon the source of light: either (1) laser oscillator 12 light which is amplified by flared amplifier 20 or (2) self-oscillation light associated with flared amplifier 20. Thus, if a detection scheme is used which discriminates based on wavelength of the collected light, such a scheme can be used to improve the light characteristics of MOPA and other devices.

In addition to the above method for separating amplified input light by wavelength from the light output associated with the parasitic mode, the present invention can also be used to separate such light by polarization. Such an embodiment can be fabricated out of the integrated MOPA device shown in FIGS. 1A and 1B by intentionally introducing into either laser oscillator 12 or, in the alternative, flared amplifier 16 a means to propagate generated light in the transverse-magnetic (TM) mode in contrast to the transverse-electric (TE) mode. For example, since the main MOPA light and the parasitic light in structures similar to those shown in FIGS. 1A and 1B generate and propagate light in the TE mode, intentionally providing a means to generate self-oscillation light inflared amplifier 16 in the TM mode would allow a collection scheme to discriminate based upon polarization by collecting only TE light. In the alternative, a means could be provided in laser oscillator 12 to generate main MOPA light in the TM mode and, thus, allow for a collection scheme which can selectively detect TM light originating from laser oscillator 12 and discriminate against self-oscillating light originating from amplifier 16 (i.e., TE-mode light). In accordance with the present invention, there are many ways of implementing this particular embodiment of the present invention.

For example, strain can be introduced in either the laser oscillator 12 waveguide or, in the alternative, the flared amplifier 16 waveguide, to provide for the generation of TM light in those regions. As is well known to those skilled in the art, such strain can be introduced in group III–V compound semi-conductors by the introduction of particular elements to provide for lattice mismatched heterostructures. Such strain can convert the generation of light from the TE mode to the TM mode and, thus, allow for a system that discriminates based on polarization of the collected light.

FIGS. 3–8A and B discussed above illustrate embodiments of the present invention wherein the method of suppressing self-oscillation light in the laser amplifier includes forming a region on the semiconductor substrate to support a parasitic mode of oscillation. The presence of the parasitic mode reduces the level of light emitted at the output of the amplifier which is not amplified input light. In accordance with the present invention, this function can also be accomplished by providing a separately contacted laser oscillator which injects light into the amplifier as illustrated in FIG. 9.

Figure 9:
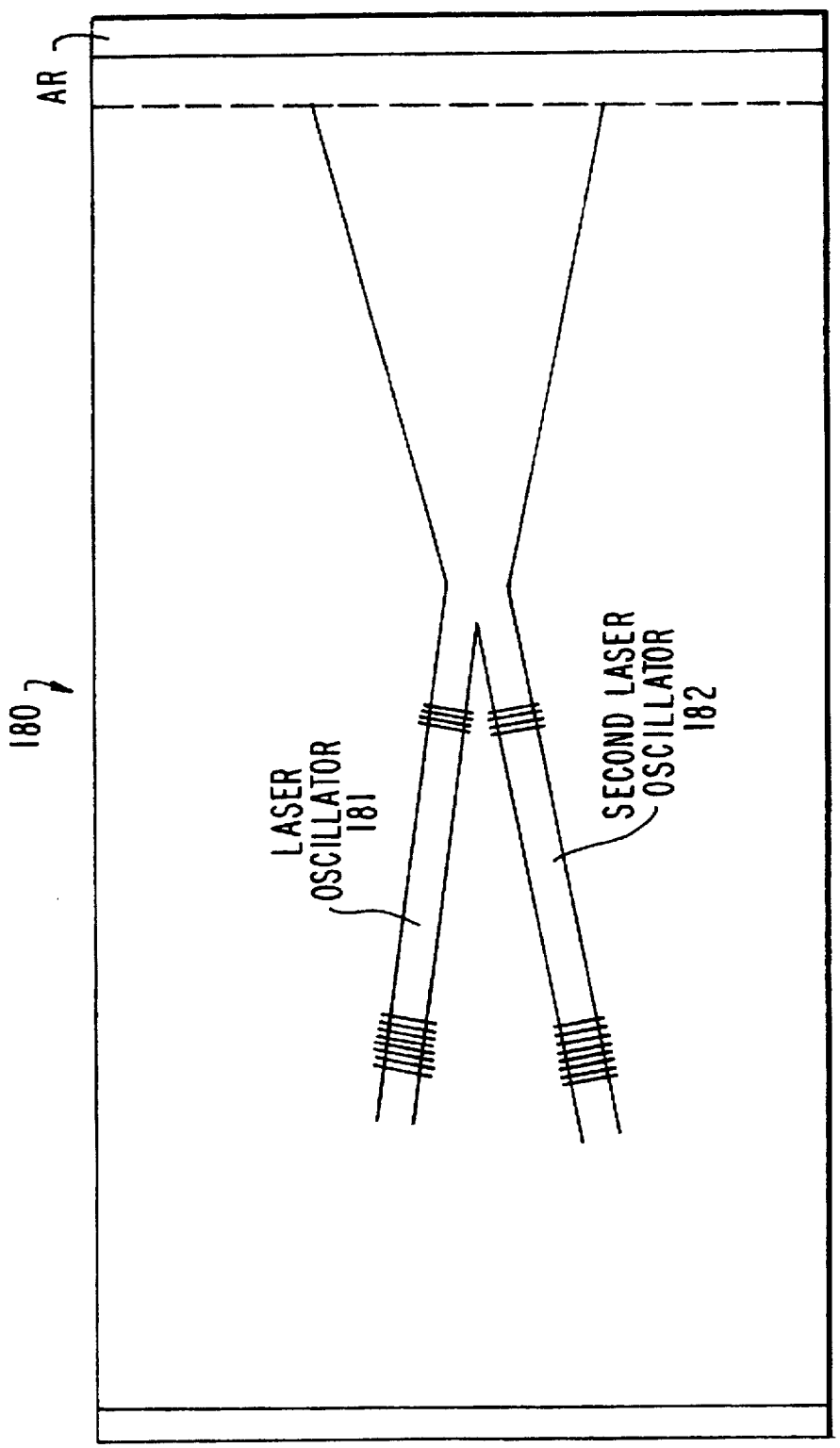
FIG. 9 illustrates an embodiment of a monolithically integrated MOPA device incorporating a second laser oscillator in accordance with the present invention.

As shown in FIG. 9, MOPA 180 includes a first laser oscillator 181, similar to those described above, and a second adjacent laser oscillator 182 for actively injecting light into the amplifier to saturate the gain therein and, thus, reduce the level of light emitted by the MOPA that is not amplified input light. In contrast to the embodiments discussed above, MOPA 180 requires the use of an additional electrical contact to facilitate the turning-ON and OFF of the second laser oscillator.

Figure 10:
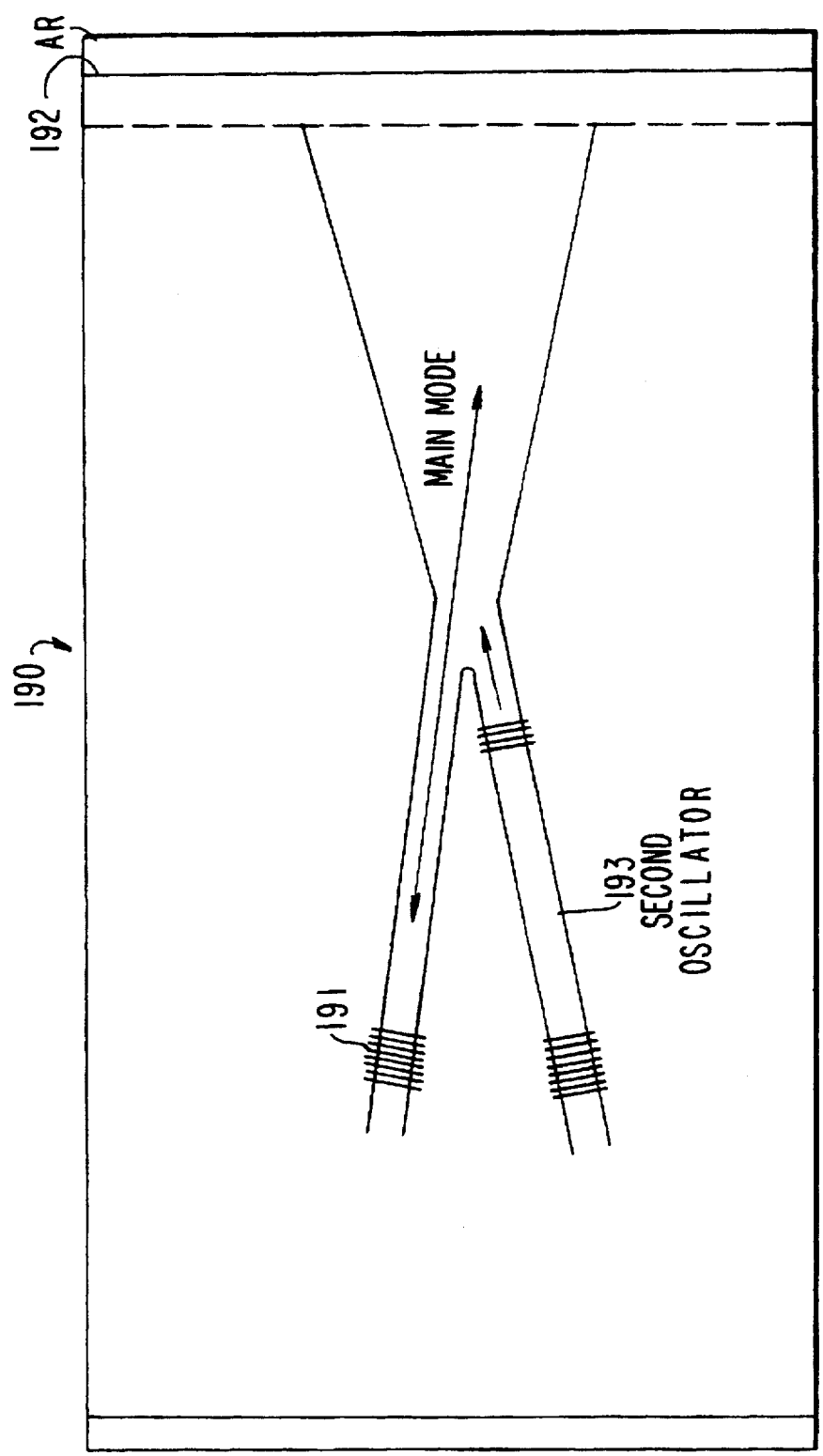
FIG. 10 illustrates an embodiment of a laser oscillator incorporating a second laser oscillator in accordance with the present invention.

FIG. 10 illustrates a variation on the embodiment of FIG. 9 wherein a laser oscillator (not a MOPA) includes a provision for the separate injection of light into the oscillator. As shown in FIG. 10, oscillator 190 provides a main mode of oscillation via grating 191 and anti-reflection coated facet 192. Second oscillator 193 is used to inject light into the oscillator formed by grating 191 and facet 192 to saturate the gain therein and, thus, to reduce the level of light emitted by the oscillator which is not main mode light (i.e., amplified light). In contrast to a conventional MOPA device wherein an oscillator is physically separated from a flared amplifier, the oscillator of FIG. 10 includes a laser oscillator which is "integrated into" a flared region (i.e., the laser oscillator shares the same wave-guiding region as the flared amplifier since the anti-reflection-coated facet provides the feedback to the laser oscillator).

Figure 11:
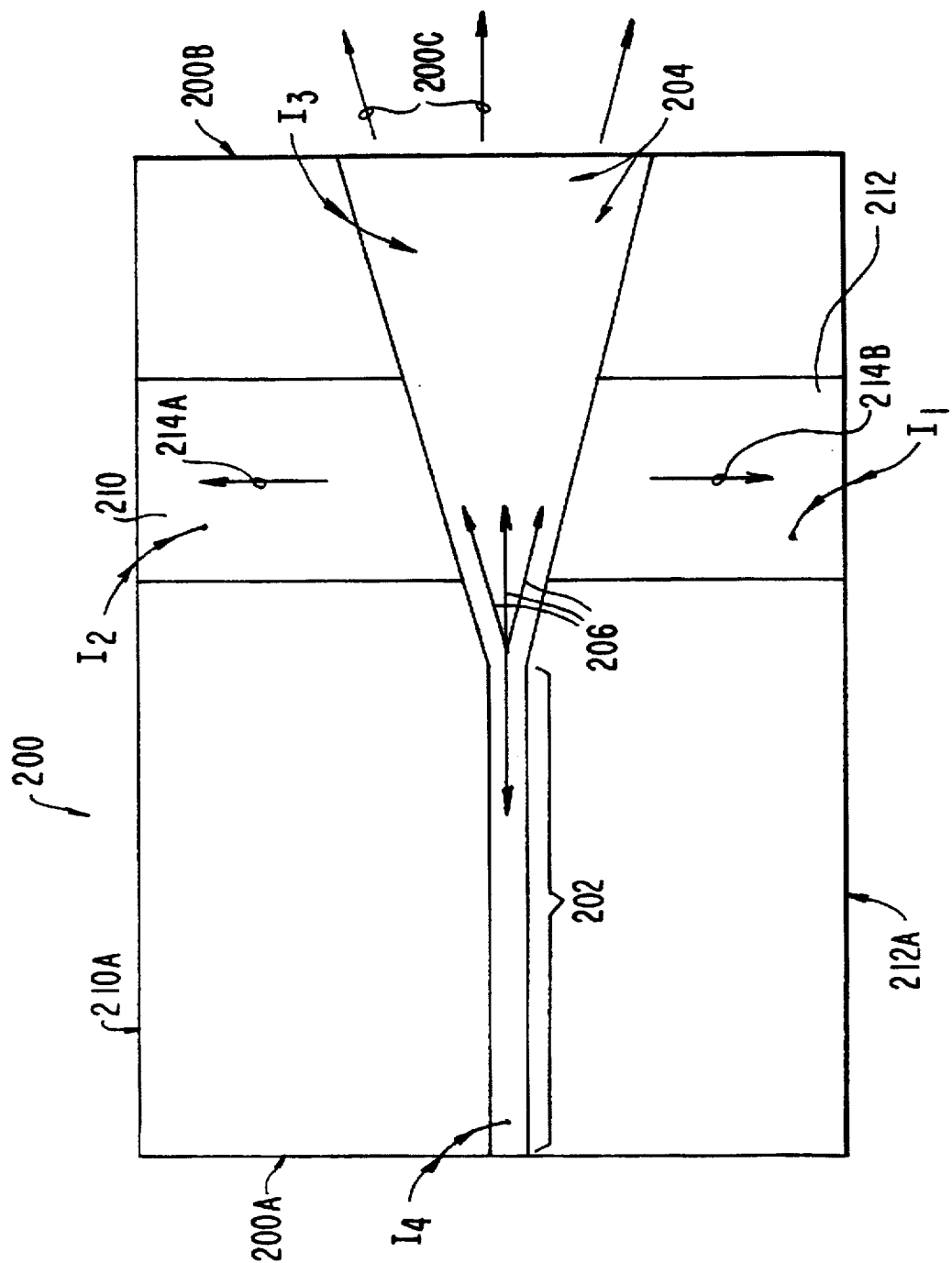
FIG. 11 illustrates another embodiment of a laser oscillator incorporating a second laser oscillator in accordance with the present invention.

FIG. 11 illustrates another embodiment of the present invention wherein a second lightwave is used to alter the intensity, wavelength, or other optical properties of a first light wave generated by a laser oscillator to improve the oscillator's output characteristics. As shown in FIG. 11, oscillator 200 includes a single transverse mode current-pumped gain section 202 optically coupled to a flared gain section 204. Sections 202 and 204 facilitate the propagation of a first light wave 206 with a diverging wave front. Oscillator 200 includes a first cleaved facet 200A having high reflectivity (e.g., 95 percent) and a second cleaved facet 200B having low reflectivity (e.g., 1 to 5 percent) for providing feedback (reflective) to the oscillator. Such feedback facilitates the generation of an output light beam 200C adjacent cleaved facet 200B. Sections 210 and 212 (with cleaved facets 210A and 212A, respectively) facilitate the generation of a second light wave 214A and 214B used to improve the output characteristics of oscillator 200 as described below. Oscillator 200 includes current contacts (not shown) to inject: (1) currents I3 and I4 to facilitate generation of the first light wave 206 and (2) currents I1 and I2 to facilitate generation of the second light wave 214A and 214B. Currents I1 through I4 could be separately controlled although some could be operated together. Typically, I4 would be modulated while I1 through I3 would be DC driven. Oscillator 200 works as follows.

Currents I3 and I4 are used to generate the first light wave 206 with a diverging wavefront. Currents I1 and I2 are used to generate the second light wave 214A and 214B which is used to alter the intensity, wavelength, or other optical properties of the first light wave 206 as it progates through the semiconductor. Such alteration occurs because second light wave 214A and 214B saturates (clamps) the gain in region 206 as discussed above with respect to the other embodiments of the present invention. Because of such saturation, the intensity, wavelength and other optical properties (e.g., polarization, propagation angle and focal depth) associated with the first light wave 206 can be altered in accordance with present invention.

In accordance with the present invention, although the second light wave illustrated in FIG. 11 is shown as being transverse to the longitudinal axis of gain section 202, this does not have to be the case. For example, as with the other embodiments of the present invention discussed above, the second light wave could instead be of some other angle less than ninety degrees. In addition, if the second light wave is of the same angle as the first light wave, the second lightwave could also be used in accordance with the present invention if it is of a different wavelength or polarization than the first light wave so as to facilitate separation of the second light wave from the output beam of the oscillator, as discussed above with respect to the other embodiments of the present invention discussed above.

Thus, in summary, the above illustrates a few of many possible structures for supporting a low-threshold parasitic mode of self-oscillation in a semiconductor amplifier for improving the light output characteristics of MOPA and other devices and the application of such concepts to the improvement of oscillator output characteristics generally.

It will be apparent to one of ordinary skill in the art that although the method of the present invention has been discussed above with particular reference to a flared amplifier structure shown in the above FIGURES, it is also applicable to other types and geometries of travelling-wave semiconductor amplifiers and oscillators as well. For example, the method of the present invention could be used in semiconductor amplifiers such as those described in above-incorporated U.S. patent applications Ser. Nos. 07/948,673, 08/001,735 and 08/010,279.

It will also be apparent to one of ordinary skill in the art that although the semiconductor amplifier of the present invention has been discussed above with particular reference to monolithically integrated MOPA devices, it is also employable in other types of MOPA and other devices as well. For example, the semiconductor amplifier of the present invention could be used in discrete MOPA devices. Furthermore, it could also be used in devices such as those described in above-incorporated U.S. patent application Ser. Nos. 07/948,673, 08/001,735 and 08/010,278.

One of ordinary skill in the art will appreciate that the present invention can be practiced by other than the described embodiments, which are presented for purposes of illustration and not of limitation, and the present invention is limited only by the claims which follow.

What is claimed is:

1. A semiconductor device, containing an optical amplifier, comprising:
   a current-pumped gain region formed on a semiconductor substrate having an input adapted for receiving input light of a first intensity and having an output adapted for providing amplified light at a second intensity, said input and output defining a first optical path though the amplifier; and
   a second region formed on the semiconductor substrate forming a second optical path different from said first optical path for supporting a parasitic mode of laser oscillation in said second optical path;
   light from the parasitic mode propagating in at least a portion of the amplifier in the absence of the input light so that the presence of the parasitic mode reduces the level of light emitted at the output of the amplifier which is not amplified input light and the parasitic mode terminates in the presence of the input light.

2. The semiconductor device of claim 1 wherein the light output from the parasitic mode can be separated from the amplified input light.

3. The semiconductor device of claim 1 wherein the light output from the parasitic mode can be spatially separated from the amplified input light.

4. The semiconductor device of claim 1 wherein the light output from the parasitic mode can be separated by angle from the amplified input light.

5. A semiconductor device, containing an optical amplifier, comprising:
   a current-pumped gain region formed on a semiconductor substrate having an input adapted for receiving input light of a first intensity and having an output adapted for providing amplified light at a second intensity, said input and output defining a first optical path though the amplifier; and
   a second region formed on the semiconductor substrate forming a second optical path different from said first optical path for supporting a parasitic mode of laser oscillation in said second optical path;
   light from the parasitic mode propagating in at least a portion of the amplifier, wherein the presence of the parasitic mode reduces the level of light emitted at the output of the amplifier which is not amplified input light and wherein the light output from the parasitic mode can be separated by polarization from the amplified input light.

6. A semiconductor device, containing an optical amplifier, comprising:
   a current-pumped gain region formed on a semiconductor substrate having an input adapted for receiving input light of a first intensity and having an output adapted for providing amplified light at a second intensity, said input and output defining a first optical path though the amplifier; and
   a second region formed on the semiconductor substrate forming a second optical path different from said first optical path for supporting a parasitic mode of laser oscillation in said second optical path;
   light from the parasitic mode propagating in at least a portion of the amplifier, wherein the presence of the parasitic mode reduces the level of light emitted at the output of the amplifier which is not amplified input light and wherein the light output from the parasitic mode can be separated by wavelength from the amplified input light.

7. A semiconductor device, containing an optical amplifier, comprising:
   a current-pumped gain region formed on a semiconductor substrate having an input adapted for receiving input light of a first intensity and having an output adapted for providing amplified light at a second intensity, said input and output defining a first optical path though the amplifier; and
   a second region formed on the semiconductor substrate forming a second optical path different from said first optical path for supporting a parasitic mode of laser oscillation in said second optical path;
   light from the parasitic mode propagating in at least a portion of the amplifier, wherein the presence of the parasitic mode reduces the level of light emitted at the output of the amplifier which is not amplified input light and wherein the light output from the parasitic mode can be separated by focal position from the amplified input light.

8. The semiconductor device of claim 1 wherein the second region includes at least one reflective structure for supporting the parasitic mode in proximity to said current-pumped gain region.

9. The semiconductor device of claim 8 wherein said reflective structure comprises one or more cleaved facets oriented in said second optical path.

10. A semiconductor device, containing an optical amplifier, comprising:
    a current-pumped gain region formed on a semiconductor substrate having an input adapted for receiving input light of a first intensity and having an output adapted for providing amplified light at a second intensity, said input and output defining a first optical path through the amplifier; and
    a second region formed on the semiconductor substrate forming a second optical path different from said first optical path for
    a second region formed on the semiconductor substrate forming a second optical path different from said first optical path for supporting a parasitic mode of laser oscillation in said second optical path;

light from the parasitic mode propagating in at least a portion of the amplifier, wherein the presence of the parasitic mode reduces the level of light emitted at the output of the amplifier which is not amplified input light;

said second region having at least one reflective structure for supporting the parasitic mode in proximity to said current-pumped gain region and comprises at least one periodic grating.

11. A semiconductor device, containing an optical amplifier, comprising:

a current-pumped gain region formed on a semiconductor substrate having an input adapted for receiving input light of a first intensity and having an output adapted for providing amplified light at a second intensity, said input and output defining a first optical path through the amplifier; and a second region formed on the semiconductor substrate forming a second optical path different from said first optical path for supporting a parasitic mode of laser oscillation in said second optical path, light from the parasitic mode propagating in at least a portion of the amplifier, wherein the presence of the parasitic mode reduces the level of light emitted at the output of the amplifier which is not amplified input light and means for supplying electrical bias to at least a portion of said second region to modulate the parasitic mode of laser oscillation.

12. A semiconductor device, containing an optical amplifier, comprising:

a current-pumped gain region formed on a semiconductor substrate having an input adapted for receiving input light of a first intensity and having an output adapted for providing amplified light at a second intensity, said input and output defining a first optical path though the amplifier; and a second region including at least a portion of the gain region formed on the semiconductor substrate forming a second optical path different from said first optical path for supporting a parasitic mode of laser oscillation in said second optical path in the absence of the input light so that the presence of the parasitic mode reduces the level of light emitted at the output of the amplifier which is not amplified input light and the parasitic mode terminates in the presence of the input light.

13. The semiconductor device of claim 12 wherein the light output from the parasitic mode can be separated from the amplified input light.

14. The semiconductor device of claim 12 wherein the light output from the parasitic mode can be spatially separated from the amplified input light.

15. The semiconductor device of claim 12 wherein the second region includes at least one reflective structure for supporting the parasitic mode in proximity to said current-pumped gain region.

16. A semiconductor device, containing an optical amplifier, comprising:

a current-pumped gain region formed on a semiconductor substrate having an input adapted for receiving input light of a first intensity and having an output adapted for providing amplified light at a second intensity, said input and output defining a first optical path though the amplifier; and a second region including at least a portion of the gain region formed on the semiconductor substrate forming a second optical path different from said first optical path for supporting a parasitic mode of laser oscillation in said second optical path, wherein the presence of the parasitic mode reduces the level of light emitted at the output of the amplifier which is not amplified input light; and means for supplying electrical bias to at least a portion of said second region to modulate the parasitic mode of oscillation.

17. A master oscillator power amplifier device comprising:

a laser oscillator; and a semiconductor amplifier comprising:

a current-pumped gain region formed on a semiconductor substrate having an input adapted for receiving input light of a first intensity from the laser oscillator and having an output adapted for providing amplified light at a second intensity, said input and output defining a first optical path though the amplifier; and a second region including at least a portion of the gain region formed on the semiconductor substrate forming a second optical path different from said first optical path for supporting a parasitic mode of laser oscillation in said second optical path in the absence of the input light so that the presence of the parasitic mode reduces the level of light emitted at the output of the amplifier which is not amplified input light and the parasitic mode terminates in the presence of the input light.

18. The device of claim 17 wherein the second region includes at least one reflective structure for supporting the parasitic mode in proximity to said current-pumped gain region.

19. The device of claim 18 wherein said reflective structure comprises one or more cleaved facets oriented substantially perpendicular to said input and output of the amplifier.

20. A master oscillator power amplifier device comprising:

a laser oscillator; and a semiconductor amplifier comprising:

a current-pumped gain region formed on a semiconductor substrate having an input adapted for receiving input light of a first intensity from the laser oscillator and having an output adapted for providing amplified light at a second intensity, said input and output defining a first optical path though the amplifier; and a second region including at least a portion of the gain region formed on the semiconductor substrate forming a second optical path different from said first optical path for supporting a parasitic mode of laser oscillation in said second optical path, wherein the presence of the parasitic mode reduces the level of light emitted at the output of the amplifier which is not amplified input light;

said second region having at least one reflective structure for supporting the parasitic mode in proximity to said current-pumped gain region and comprises at least one periodic grating.

21. A master oscillator power amplifier device comprising:

a laser oscillator; and a semiconductor amplifier comprising:

a current-pumped gain region formed on a semiconductor substrate having an input adapted for receiving input light of a first intensity from the laser oscillator and having an output adapted for providing amplified light at a second intensity, said input and output defining a first optical path though the amplifier; and a second region including at least a portion of the gain region formed on the semiconductor substrate forming a second optical path different from said first optical path for supporting a parasitic mode of laser oscillation in said second optical path, wherein the presence of the parasitic mode reduces the level of light emitted at the output of the amplifier which is not amplified input light; and means for supplying electrical bias to at least a portion of said second region to modulate the parasitic mode of oscillation.

22. A master oscillator power amplifier device comprising:
- a laser oscillator; and
- a semiconductor amplifier comprising:
  - a current-pumped gain region formed on a semiconductor substrate having an input adapted for receiving input light of a first intensity and having an output adapted for providing amplified light at a second intensity, said input and output defining a first optical path though the amplifier and
  - a second region including at least a portion of the gain region formed on the semiconductor substrate forming a second optical path different from said first optical path for supporting a parasitic mode of oscillation in the absence of the input light; light from the parasitic mode propagating in at least a portion of the amplifier such that the light output from the parasitic mode can be separated from the amplified input light and wherein the parasitic mode terminates in the presence of the input light.

23. The device of claim 22 wherein the light output from the parasitic mode can be separated from the amplified input light.

24. The device of claim 22 wherein the presence of the parasitic mode reduces the level of light emitted at the output end of the amplifier which is not amplified input light.

25. A master oscillator power amplifier device comprising:
- a laser oscillator; and
- a semiconductor amplifier comprising:
  - a current-pumped gain region formed on a semiconductor substrate having an input adapted for receiving input light of a first intensity and having an output adapted for providing amplified light at a second intensity, said input and output defining a first optical path though the amplifier; and
  - a second region including at least a portion of the gain region formed on the semiconductor substrate forming a second optical path different from said first optical path for supporting a parasitic mode of oscillation,
  - light from the parasitic mode propagating in at least a portion of the amplifier, such that the light output from the parasitic mode can be separated from the amplified input light; and
- means for supplying electrical bias to at least a portion of said second region to modulate the parasitic mode of oscillation.

26. The device of claim 17 or 22 wherein:
said laser oscillator is a distributed Bragg reflector laser;
said amplifier is a flared amplifier; and
said second region includes one or more cleaved facets oriented in said second optical path.

27. A method of suppressing longitudinal self-oscillation in a semiconductor amplifier comprising the steps of:
(a) forming a current-pump gain region on a semiconductor substrate having an input adapted for receiving input light of a first intensity and having an output adapted for providing amplified light at a second intensity, said input and output defining a first optical path though the amplifier; and
(b) forming a second region on the semiconductor substrate forming a second optical path different from said first optical path for supporting a parasitic mode of laser oscillation in said second optical path in the absence of the input light from said parasitic mode propagating in at least a portion of the amplifier such that the light output from the parasitic mode can be separated from amplified input light and wherein the parasitic mode terminates in the presence of the input light.

28. A method of suppressing longitudinal self-oscillation in a semiconductor amplifier comprising the steps of:
(a) forming a current-pump gain region on a semiconductor substrate having an input adapted for receiving input light of a first intensity and having an output adapted for providing amplified light at a second intensity, said input and output defining a first optical path though the amplifier; and
(b) forming a second region on the semiconductor substrate forming a second optical path different from said first optical path for supporting a parasitic mode of laser oscillation in said second optical path,
light from the parasitic mode propagating in at least a portion of the amplifier such that the light output from the parasitic mode can be separated from the amplified input light;
said amplifier formed on the same substrate as a second laser oscillator, the light output of said second laser oscillator being injected into said input of said amplifier.

29. The method of claim 27 wherein the presence of the parasitic mode reduces the level of light emitted at the output end of the amplifier which is not amplified input light.

30. A semiconductor optical amplifier comprising:
a current-pumped gain region formed on a semiconductor substrate having an input adapted for receiving input light of a first intensity and having an output adapted for providing amplified light at a second intensity, said input and output defining a first optical path though the amplifier; and
oscillatory means forming a second optical path different from said first optical path for suppressing longitudinal self-oscillation in the absence of the input light such that any sustained light emission is utilized in a parasitic mode of oscillation by said oscillatory means, said parasitic mode of oscillation terminating in the presence of the input light.

31. A master oscillator power amplifier device comprising:
a laser oscillator; and
a traveling-wave semiconductor amplifier comprising:
  a current-pumped gain region formed on a semiconductor substrate having an input adapted for receiving input light of a first intensity from the laser oscillator and having an output adapted for providing amplified light at a second intensity, said input and output defining a first optical path though the amplifier; and oscillatory means forming a second optical path different from said first optical path for suppressing longitudinal self-oscillation in the absence of the input light such that any sustained light emission is utilized in a parasitic mode of oscillation by said oscillatory means, said parasitic mode of oscillation terminating in the presence of the input light.

32. A semiconductor device, containing an optical amplifier comprising:

a current-pumped gain region formed on a semiconductor substrate having an input adapted for receiving input light of a first intensity and having an output adapted for providing amplified light at a second intensity, said input and output defining a first optical path though the amplifier; and a second region formed on the semiconductor substrate for forming a second beam of light from an parasitic mode of oscillation coexistent in the amplifier along a second optical path different from said first optical path suppressing longitudinal self-oscillation of the semiconductor device, wherein, in the absence of input light, the presence of the second beam of light reduces, the level of light emitted at the output of the amplifier which is not amplified input light and in the presence of the input light, the second beam of light from the parasitic mode of oscillation is extinguished.

33. A semiconductor amplifier device for amplifying light comprising:

a first optical cavity formed in a first direction to receive light input of a first intensity and amplify the light to a second higher intensity;

a second optical cavity formed in a direction different from said first cavity and having a gain threshold for lasing that is lower than that of said first cavity;

wherein the gain threshold for said second cavity being such that:
(1) when there is no light input to the amplifier device, said second cavity clamps the gain of the amplifier device at its threshold to lase in the different direction; and
(2) when there is light input to the amplifier device, said second cavity does not lase in the different direction due to saturation of the amplifier gain available below its threshold by the light input during light amplification in the first direction, whereby the level of light emitted at the amplifier output not associated with the light amplification in the first optical cavity is reduced.

34. The semiconductor amplifier device of claim 33 wherein said amplifier device has at least a portion thereof characterized by a diverging gain region.

35. The semiconductor amplifier device for claim 34 wherein the light input is provided by an oscillator integral with an input end of said diverging gain region.

36. The semiconductor amplifier device of claim 35 further comprising a pre-amplifier region integrally formed between said oscillator and said diverging gain region.

37. The semiconductor device of claim 1 further comprising an unstable resonator comprising a single mode region integral with a flared gain region comprising said current-pumped gain region.

38. The semiconductor optical amplifier of claim 30 further comprising an unstable resonator comprising a single mode region integral with a flared gain region comprising said current-pumped gain region.

* * * * *